(12) United States Patent
Patel et al.

(10) Patent No.: US 10,514,396 B2
(45) Date of Patent: Dec. 24, 2019

(54) ELECTRICAL SENSOR ATTACHABLE TO AN ELECTRICAL DISTRIBUTION CABLE

(71) Applicant: REPL International Limited, Swindon, Wiltshire (GB)

(72) Inventors: Rutton Homi Patel, Swindon (GB); Neville Kyme, Swindon (GB)

(73) Assignee: REPL International Limited, Swindon, Wiltshire (GB)

( * ) Notice: Subject to any disclaimer, the term of this patent is extended or adjusted under 35 U.S.C. 154(b) by 0 days.

(21) Appl. No.: 15/124,559

(22) PCT Filed: Mar. 10, 2015

(86) PCT No.: PCT/EP2015/054960
§ 371 (c)(1),
(2) Date: Sep. 8, 2016

(87) PCT Pub. No.: WO2015/135939
PCT Pub. Date: Sep. 17, 2015

(65) Prior Publication Data
US 2017/0016936 A1 Jan. 19, 2017

(30) Foreign Application Priority Data
Mar. 10, 2014 (GB) .................................. 1404181.8

(51) Int. Cl.
*G01R 15/14* (2006.01)
*G01R 19/00* (2006.01)
(52) U.S. Cl.
CPC ....... *G01R 15/142* (2013.01); *G01R 19/0046* (2013.01)
(58) Field of Classification Search
CPC ... G01R 15/14; G01R 15/142; G01R 19/0046
See application file for complete search history.

(56) References Cited

U.S. PATENT DOCUMENTS 5,006,846 A * 4/1991 Granville ............. G01R 15/183
324/126
5,318,459 A 6/1994 Shields
(Continued)

FOREIGN PATENT DOCUMENTS

| CA | 1065016 A2 | 10/1979 |
| DE | 3707707 A1 | 9/1988 |
| EP | 0750382 A2 | 12/1996 |

OTHER PUBLICATIONS

International Search Report and Written Opinion for PCT/EP2015/054960, dated Jul. 10, 2015.

*Primary Examiner* — Walter L Lindsay, Jr.
*Assistant Examiner* — Milton Gonzalez
(74) *Attorney, Agent, or Firm* — Westman, Champlin & Koehler, P.A.; Z. Peter Sawicki; Amanda M. Prose

(57) ABSTRACT

Power distribution networks need to monitor the electrical power at points around the network. A unit which senses the electrical characteristics of the network can also sense other environmental characteristics of the electrical network at that location. An electrical sensor unit attachable to an insulated electrical distribution cable comprises at least one electrical sensor for at least one of current, voltage, and phase angle of electrical power being transmitted in the cable, a source of electrical power for driving the electrical sensors, and a socket for receiving an environmental sensor and comprising connections for the source of electrical power. The unit comprises an annular body defining an axial passage through which an electrical conductor can pass, the annular body housing an electrical sensor in the form of a current sensor including a loop extending around the axial passage.

15 Claims, 3 Drawing Sheets

(56) References Cited

U.S. PATENT DOCUMENTS

| | | | | |
|---|---|---|---|---|
| 5,548,523 | A * | 8/1996 | Wehrli, III | G01R 15/142 |
| | | | | 439/391 |
| 8,179,122 | B2 * | 5/2012 | Ibuki | G01R 15/181 |
| | | | | 324/117 H |
| 8,536,857 | B2 * | 9/2013 | Nero, Jr. | G01R 15/142 |
| | | | | 324/117 H |
| 8,624,747 | B2 * | 1/2014 | Davis | G01R 19/2513 |
| | | | | 324/126 |
| 2013/0208761 | A1 * | 8/2013 | Mavrides | G01J 5/089 |
| | | | | 374/121 |

\* cited by examiner

ELECTRICAL SENSOR ATTACHABLE TO AN ELECTRICAL DISTRIBUTION CABLE

CROSS-REFERENCE TO RELATED APPLICATION

This Application is a Section 371 National Stage Application of International Application No. PCT/EP2015/054960 filed Mar. 10, 2015 and published as WO 2015/135939 A1 on Sep. 17, 2015, in English, which claims priority to and benefits of GB Patent Application No. 1404181.8, filed Mar. 10, 2014, the contents of which are hereby incorporated by reference in their entirety.

FIELD OF THE INVENTION

The present invention relates to an electrical termination for use in power distribution networks, in particular but not exclusively those parts of networks which are not suspended and/or are principally underground, and/or are covered by an electrically insulating coating.

BACKGROUND ART

Electrical power networks have historically been hierarchical in nature, with power generation facilities feeding electrical power into the network at one end, and a range of customers drawing power from the network at another end (logically speaking). Such an arrangement is convenient to the power distribution companies because when maintenance work needs to be carried out on the network, circuit breakers at strategic points can be opened thereby isolating the relevant parts of the network and allowing work to proceed safely.

The concept of "feed-in tariffs" changes this fundamentally. According to this concept, end-user customers are given the option to install local power generation facilities, usually a renewable energy source such as solar panels, wind turbines or the like. These are connected to the electrical distribution network and, if they generate more power than the customer needs, feed the excess power back into the network. The customer is then paid for the electrical power they supply into the network.

This means that the distribution company has lost a degree of control over its network. During repair work, it can isolate sections of network from its own power generation facilities but cannot be certain that there are no customer feed-in points that are supplying power. Accordingly, the section of network may still be live, despite being isolated. During normal operation, the company will need to monitor the network in order to determine what power is actually being transmitted in order to ensure that demand is met appropriately. Distribution companies therefore need to be able to check on the local voltage, current and phase angle at distributed locations on the network. At least one such company has issued a requirement for a means of doing so; so far the proposals for doing so involve severing the cable just short of a connection, and splicing on a short section of cable that includes the necessary passive sensors and which is terminated with a standard connector via which it can be re-connected.

Such modifications need to be suited to underground (insulated) power cables. Generally, this problem does not apply in the case of suspended power lines as customer feed-in points will be on the distribution grid rather than the transmission grid. The transmission grid usually employs uninsulated extra-high-voltage cables (typically 100 kV and upwards) that are suspended from pylons in free air, which therefore acts as an insulator and a source of cooling. This is used for long-range transmission of power from medium to large power plants; only very large industrial customers take power directly from the transmission grid, and such customers do not qualify for domestic feed-in tariffs. Distribution grids accept power from nodes in the transmission grid at lower voltages of (typically) 50 kV or below, and connect to smaller industrial customers, substations for domestic customers, and feed-in points such as wind farms, solar farms, small power plants, and domestic feed-in points. These connections are often via insulated cables, which may be buried, enclosed in conduits, or suspended at lower levels.

SUMMARY OF THE INVENTION

We have realised that a unit which senses the electrical characteristics of the network can also be used to sense other environmental characteristics of the electrical network at that location. Also, we wish to avoid unnecessary additional connections within the cabling, and therefore wish to provide an arrangement that can be retrofitted without necessitating an existing cable being severed.

Thus, in its first aspect, the present invention provides an electrical sensor unit attachable to an electrical distribution cable and comprising at least one electrical sensor for at least one of current, voltage, and phase angle of electrical power being transmitted in the cable, a source of electrical power for driving the electrical sensors, and a socket for receiving an environmental sensor and comprising connections for the source of electrical power. This means that the unit can be deployed as a standard item at a cost comparable with a simple electrical sensor, and then if and when environmental sensing is desired at the location in question, then an environmental sensor can be added via the socket in order to upgrade that particular location. In this way, the essential electrical sensing can be rolled out across the network at minimum cost, while allowing selective and/or subsequent upgrades to include environmental sensing.

It is convenient for the unit to comprise an annular body defining an axial passage through which an electrical conductor can pass (preferably including its insulation), the annular body housing an electrical sensor in the form of a current sensor including a loop extending around the axial passage. This provides a convenient form for the unit which allows it to befitted in place over an existing cable without severing the cable. Instead, the cable can be released at an existing connection such as a bolted connection, and the unit fitted around the cable. Indeed, such is the convenience of this arrangement that in a second aspect the present invention relates to an electrical sensor unit attachable to an electrical distribution cable and comprising an annular body defining an axial passage through which an electrical conductor can pass, the annular body housing an electrical sensor in the form of a current sensor including a loop extending around the axial passage, independently of the first aspect. In both aspects, it is also useful for the unit to include a contact for making electrical contact with the cable thereby to supply an electrical sensor in the form of a voltage sensor. That contact can comprise a screw threaded ring, preferably arranged around the axial passage, thereby making the connection to the cable joint more straightforward.

The source of electrical power can be a battery, preferably rechargeable. This can be located in the socket, with the connections receiving power from the battery and supplying it to the electrical sensors. The battery would then be removable for replacement with a fresh battery (if the old battery had reached the end of its service life, for example), or with the environmental sensor. The environmental sensor may of course comprise a battery of its own, if needed to replace the battery that was previously in the socket.

Alternatively, the source of power can be an inductive coil arrangeable around the electrical distribution cable. This may be combined with the inductive coil used to sense current in the cable. This may feed a rechargeable battery in order to cover periods when the electrical supply is absent.

The environmental sensor can sense at least one of temperature, partial discharge, humidity, atmospheric pressure. Thus, the socket can be fitted a sensor apt to detect any or some of these, or a battery, or a blanking plug (for example if neither a battery nor a sensor is needed at that time).

A suitable form for the socket is a recess within the unit, in which case the connections are ideally located at a base of the recess.

BRIEF DESCRIPTION OF THE DRAWINGS

An embodiment of the present invention will now be described by way of example, with reference to the accompanying figures in which.

DETAILED DESCRIPTION OF THE EMBODIMENTS

Figure 1:
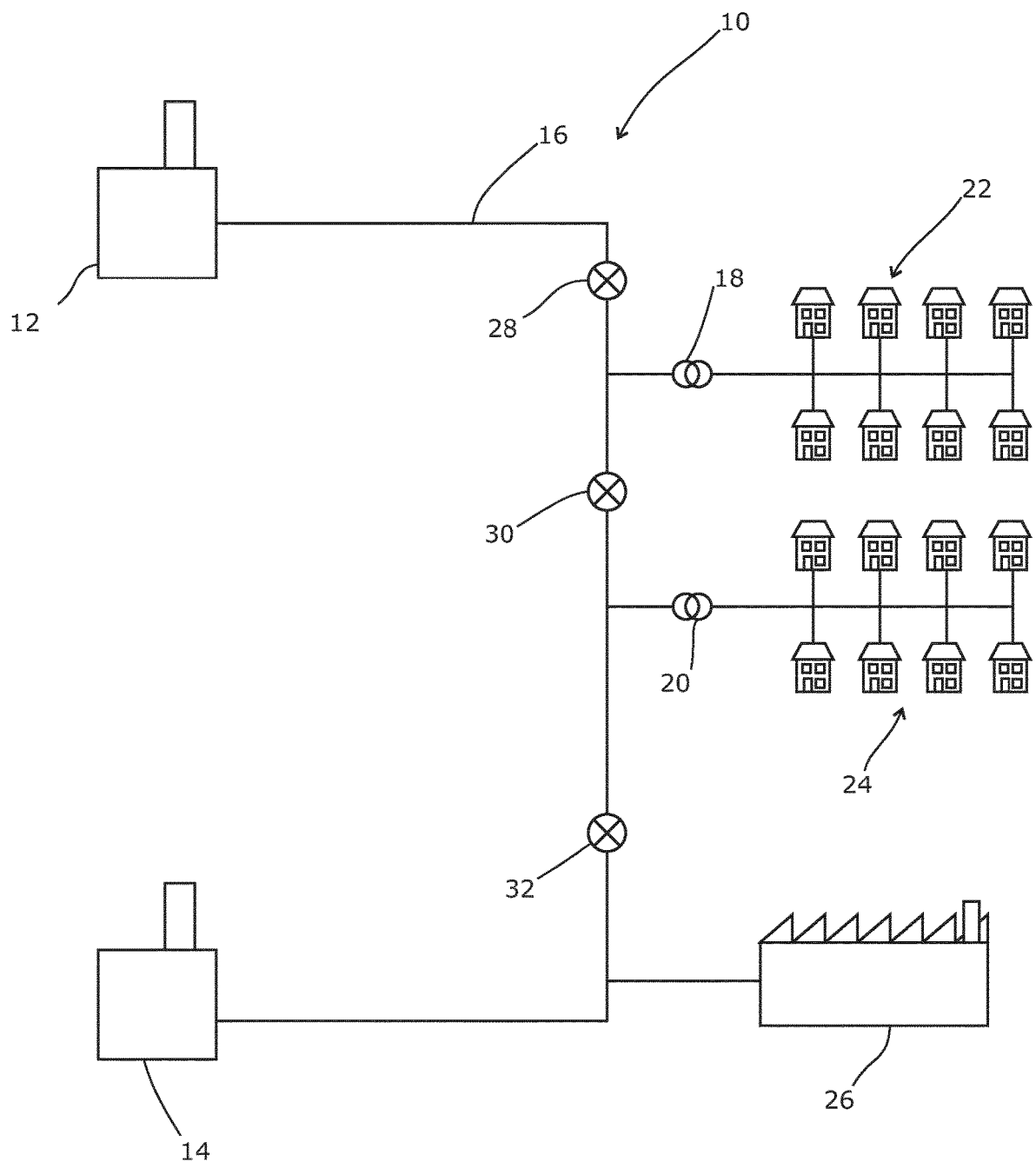
FIG. 1 shows a schematic layout of a power distribution grid.

Referring to FIG. 1, this illustrates a very schematic power distribution network 10. This includes two power sources 12, 14 which may be power stations (of any type, including fuel-burning plants, hydro-electric plants, wind farms, solar farms; nuclear plants) or may be interconnects into a high-voltage or extra-high-voltage-transmission grid from which power can be taken. These supply power to a local distribution grid 16 which will typically be at 50-100 kV and supplies a series of local substations 18, 20. Each substation 18, 20 supplies a local residential network 22, 24 at the relevant local supply voltage of (for example) 240V or 110V. Larger consumers such as an industrial unit 26 may be connected directly to the local distribution grid 16. The local distribution grid 16 is typically supplied with power by a longer-range transmission grid employing overhead transmission lines, which are typically bare (i.e. electrically uninsulated) conductors suspended between pylons or poles, normally but not exclusively in rural or sparsely developed areas. Within the local distribution grid; transmission is primarily by way of insulated lower-voltage (sub 50 kV) cables which are often not suspended, normally underground, typically but not exclusively in cities, towns and built-up areas. Such non-suspended or underground cables have an electrically insulative coating, often of a complex, multi-layer design, to prevent discharge of power between lines at different voltages or to earth; in contrast, the overhead transmission lines of the transmission grid do not require an insulating coating, because the air surrounding individual power lines prevents such discharges.

Circuit-breakers 28, 30, 32 are distributed regularly along the local distribution grid 16 in order to allow sections to be isolated for repair, maintenance and upgrade work. These can be selectively activated in order to isolate the desired section, so (for example) circuit breakers 28, 30 could be activated in order to isolate the local substation 18 and/or the section of local distribution grid 16 between the circuit breakers 28, 30. The local substation 20 and the industrial unit 26 would continue to receive power from the source 14.

However, if one or more of the houses of the local residential network 22 has a micro-generation system such as a wind turbine or a solar array, then it may be feeding power into the local residential network 22 and thereby into the local distribution grid 16. Accordingly, simply opening the circuit breakers 28, 30 does not guarantee that there are no live sections and that the local substation 18 (for example) can be worked on safely. It is necessary to install monitoring equipment which can report the actual voltages and currents present in the network. This information is also necessary in order to manage the network; if a significant number of customers are feeding a significant amount of power back into the network then this will reduce the load placed on the power sources 12, 14, which can therefore be wound down correspondingly.

As a result, at least one power distribution company has called for a unit which can monitor the local electrical state of the network at varied and distributed locations, particularly in locations where the power lines making up the network are not suspended, underground, for example, and are insulated. The present invention is based on the realisation that such a distributed monitoring system could usefully monitor much more than just the electrical state of the network. There are a number of environmental variables that could usefully be monitored, such as temperature, ambient pressure, humidity and partial discharge. Generally, electrical transmission cables operate at a slightly elevated temperature, but an increasing temperature is a reliable marker of impending failure of the cable or a connection. Likewise, the degree of partial discharge is dependent on the quality of the dielectric insulation around a conductor, so an increasing partial discharge indicates a deteriorating insulation. An increasing humidity would indicate a nearby water leak or ingress, and an increasing atmospheric pressure will (in a closed system) indicate that something is breaking down and releasing a gas. All of these are indicative of a degree of deterioration in advance of an actual failure. The environmental data will thus be of use in improving the efficiency of maintenance and repair work on the network; essential work can be carried out prior to a serious failure, and/or inspections can be relaxed on equipment that is in good condition.

Figure 3:
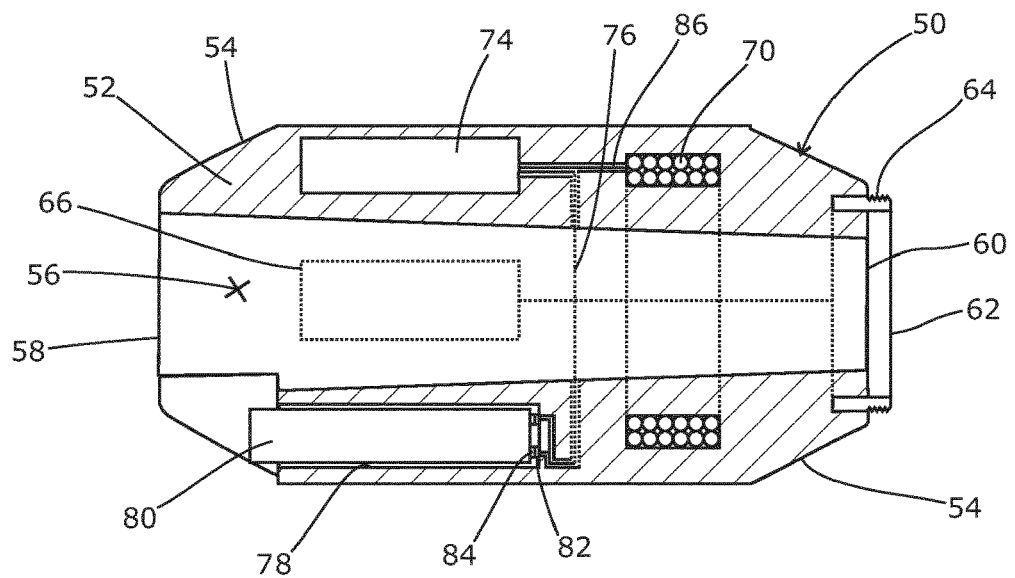
FIG. 3 is a further longitudinal section through the sensor unit, on a plane transverse to the section of FIG. 2.
Figure 4:
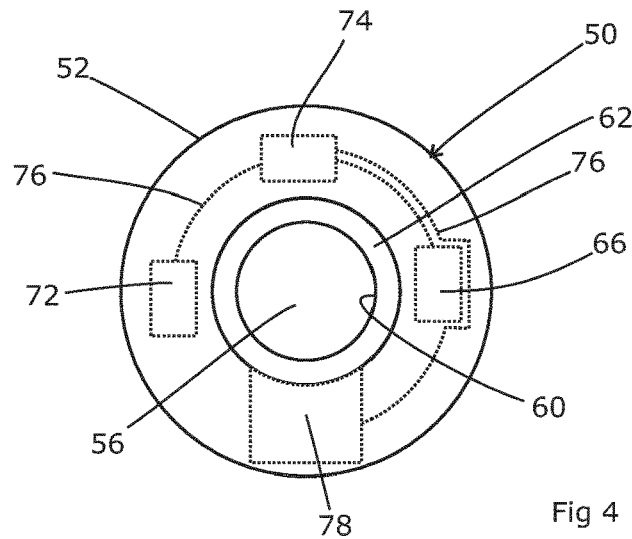
FIG. 4 is a view of the sensor unit from one end.

However, the additional cost of such monitoring may not be justified over the entire network, or the capital cost may be impractical at the same time as rolling out electrical monitoring. Therefore, we propose an electrical-state monitoring unit that can detect the necessary electrical characteristics of voltage, current and phase angle, but which also has the capacity to accept future upgrades to provide an environmental monitoring facility. Such a device is shown in FIGS. 2 to 4.

Figure 2:
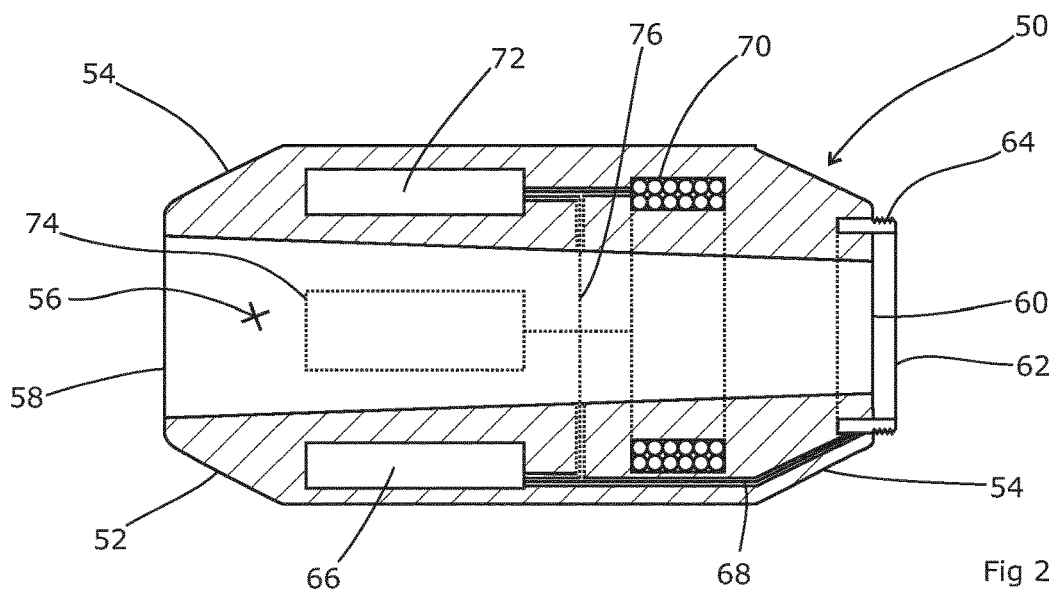
FIG. 2 is a longitudinal section through a sensor unit according to the present invention.

FIG. 2 illustrates the device 50 in a longitudinal sectional view. It comprises an elongate annular section body 52; in a generally cylindrical form and formed of an electrically insulative material; such materials are also preferably water- and/or weatherproof, so that the device in use protects the cable within. The outer ends are chamfered at 54 to avoid sharp edges. The central bore 56 of the annulus is tapered from a wide end 58 to a narrower end 60, so as to ease the process of fitting the device over a cable. The narrower end 60 is sized to suit the cable in question, providing a snug fit and reducing vibration. The wide end 58 has a good clearance around the intended size of cable, and the bore 56 between them tapers linearly and smoothly between the two thereby ensuring that there is a clearance between most of the bore 56 and the exterior of a cable within the bore 56. This minimises the frictional forces that need to be overcome to slide the device 50 into place.

A metallic collar 62 is provided around the opening of the bore 56 at the narrower end 60. This is provided with an external screw thread 64 to allow it to be fitted to a connector collar which is bolted to the cable at the electrical connection and which has a corresponding inner thread face. Thus, when the device 50 is fitted, the collar 62 is live. Fitting is straightforward in that the device 50 and the connector collar can be fitted over the free end of a cable, and the connection made including the connector collar in the junction (see FIG. 5 later). The device 50 can then be slid along the cable to meet the connector collar and screwed into place. Thus, the connection can be made easily without having to work around or manipulate the device 50. A voltage sensor 66 is located within the annular form of the device 50, together with a conductor 68 linking the voltage sensor 66 to the collar 62 and allowing it to sense directly the voltage on the cable.

A coil 70 comprising multiple loops of conducting wire is located in the annular body around the bore 56. It will therefore experience an induced current when a cable is located in the bore 56 and is carrying an alternating current. This is detected by a current sensor 72 in a generally known manner, to yield a measurement of the current flowing in the cable.

Referring to FIG. 3, this shows a section transverse to the section of FIG. 2, i.e. after rotation by 90°. Thus, the voltage sensor 66 is shown at the rear in dotted lines, located within the rear wall of the annulus. Visible in FIG. 3 is a control unit 74, which receives a signal from the current sensor 72 and the voltage sensor 66 via circumferentially-arranged conductors 76 that carry signals to the control unit 74 from the current and voltage sensors 72, 66 and from the control unit to a socket 78. The control unit 74 interprets the signals from the current and voltage sensors 72, 66 to determine RMS current and voltage levels, and calculates a phase angle from the raw current and voltage data.

The socket 78 is in the form of an elongate recess aligned with the axis of the annulus. It receives a plug-in device 80 which may be one of a number of different items offering different functionality. The circumferentially-arranged conductors 76 therefore include power and data lines running between the socket 78 and the control unit 74 which terminate in a contact arrangement 82 in the base of the socket 78. The various types of plug-in devices 80 all share an external profile that allows them to fit snugly into the recess of the socket 78. They have a length sufficient to project out of the recess, in order to allow them to be grasped and withdrawn. Each has a contact arrangement 84 on its external surface, which contacts or mates with some or all of the contacts of the contact arrangement 82. As illustrated, the contacts are at the base of the socket 78 but they may be located elsewhere provided that adequate sealing can be maintained.

The various options for the plug-in device 80 include:
i. A battery unit. This can provide power for the control unit 74 and (if necessary) the current and voltage sensors 72, 66. DC power would be transmitted back via the circumferentially-arranged conductors 76 to the control unit. 74 and from there to the current and voltage sensors 72, 66.
ii. A temperature sensor. Electrical distribution cables tend to run slightly warm. If there is a developing fault with the connection at which the device 50 is located, then an early warning sign of this be a rise in the ambient temperature around the connection due to increased resistive heating. Recording the temperature in real time over an extended period allows trends such as this to be detected, meaning that an engineer can be sent to the connection in order to inspect it and/or carry out preventative maintenance.
iii. A partial discharge sensor. The cable creates an electrical field around it, which is affected by the location of dielectric and conductive materials around it. Once fitted and powered, the cable settles into a steady state in which the field is stable. Over time, degradation of the dielectric properties of the various insulators around the cable may occur, leading to (and being accelerated by) local discharges. These can be detected as variations in the electric field, and provide another early warning of the need for inspection and/or preventative maintenance.
iv. A humidity sensor, responsive to the atmospheric humidity and/or the presence of water. Some cables and connections are buried underground and therefore at risk of water ingress. Seals are provided in order to protect the high-voltage elements, and an increasing humidity is indicative of gradual degradation or failure of the sealing arrangements.
v. An atmospheric pressure sensor; a sudden or progressive change in the ambient pressure around the unit 50 may be indicative of failure of the seals. Thus, for example, failure of the sealing could be detected during a spell of dry weather thereby giving the opportunity to correct the problem before wet weather gives rise to problems.

An individual plug-in device 80 might include one or more of the above functions, such as a battery and a temperature sensor, or a combined temperature, humidity and pressure sensor, or (space permitting) a device providing all five functions.

Power for the plug-in unit 80, the control unit 74, and, the current and voltage sensors 72, 66 may be from a battery included in the plug-in device 80. This is conveyed to the control unit 74 and thence to the current and voltage sensors 72, 66. Alternatively, or in addition, the control unit can be powered by induced currents generated in a coil around cable; this may be part of, or co-located with the current-sensing coil 70. FIG. 3 shows a connection 86 leading to the control unit for this purpose.

Drawing power from an inductive coil in this way means that a battery in the plug-in device 80 need, not be replaced (or recharged) on a regular basis. Alternatively, a rechargeable battery could be provided in the plug-in device 80 which is kept charged from the inductive coil and allows the unit 50 to continue operating during a power outage. If a battery is not needed for the plug-in device 80, then the unit 50 may be supplied ab initio with a blanking plug fitted in the recess 78 to provide, the necessary sealing and/or mechanical support.

The data from the control unit 74 needs to be conveyed to the world outside the unit 50 by some means. The ideal means for doing so may depend on the context in which the unit 50 is to be fitted, meaning that the unit 50 may need to come in a plurality of different models each providing a different transmission modality. Alternatively, the plug-in device 80 may provide a communications function; this may be the sole communications function for the device, or it may be an alternative to a built-in communications function. In the latter case, the control unit 74 may be programmed to use the built-in communications function unless there is a communications function in the plug-in device 80, in which case it uses that.

The various communications functions may include:
i. a SIM card and an associated GSM or 3G or 4G or other cellular communications capability
ii. a short-range communications protocol to transmit data to a local collecting unit with Internet access, such a Bluetooth; WiFi, or one of a range of rf communications protocols that allow short-range transmission through earth and the like
iii. a cable connection, which may be connected to a local collecting unit
iv. a connection for receiving an optical fibre, which may be wound around the cable; this will be impervious to interference from the electrical power transmitted via the cable but (on the other hand) is susceptible to damage if the cable itself is damaged. It will be preferably for the connection to include an 'in' and an 'out' socket to allow the optical fibre to follow the length of the cable, with the multiple units 50 along the length of the cable being multiplexed by time and/or frequency division.

Figure 5:
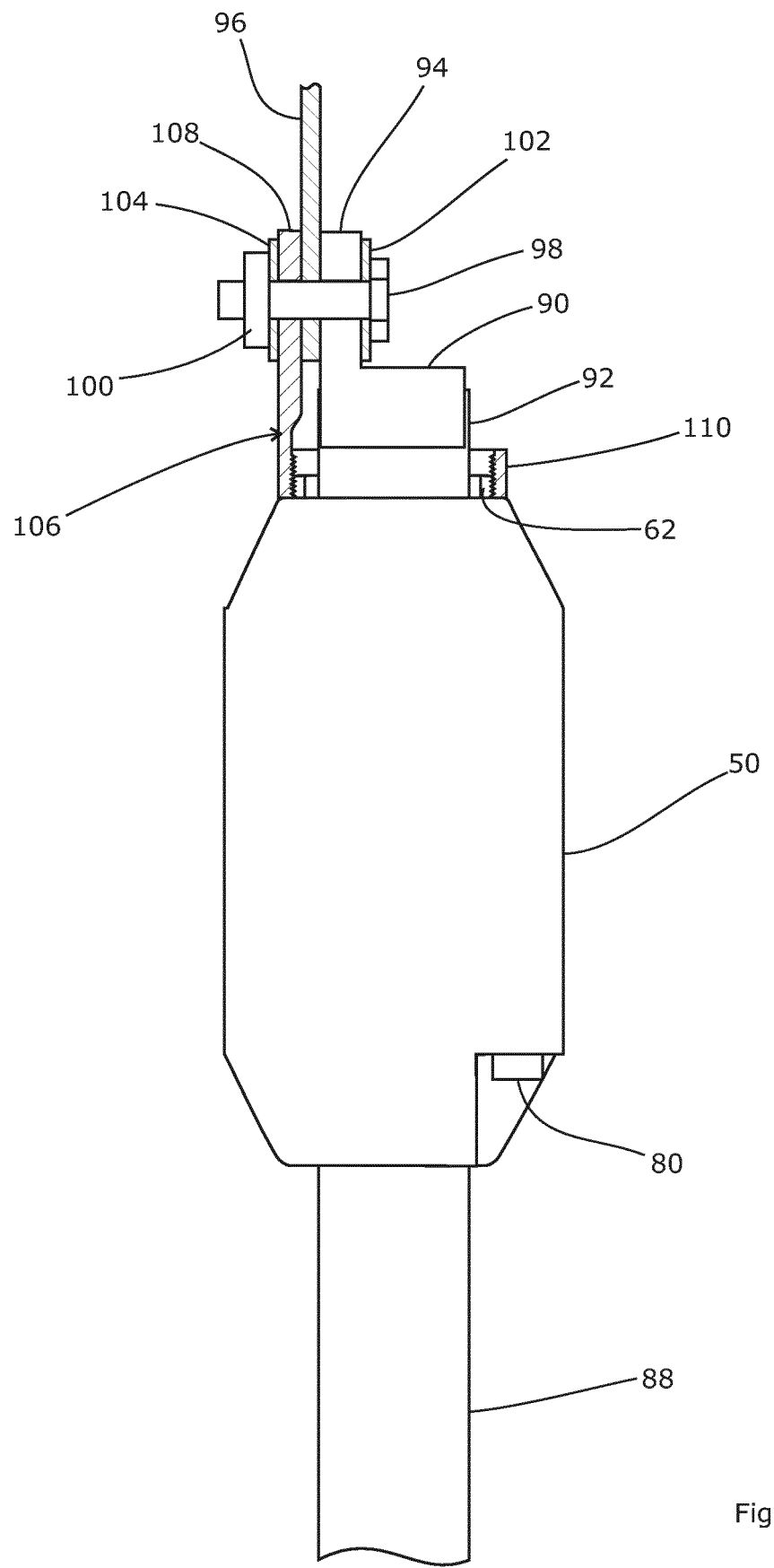
FIG. 5 is a view from one side of the sensor unit fitted to a cable, in partial section.

FIG. 5 shows the unit 50 in place on a cable 88, arranged to pass through the central bore 56 of the unit 50. Thus, the unit 50 sits around the cable 88. The cable 88 comprises an inner conductor 90 surrounded by an insulating covering 92, part of which is removed to allow the necessary electrical connection to be made between the collar 62 and the inner conductor 90; at its end, the conductor 90 is flattened to provide a flange 94 which can be bolted to a connector 96 via a bolt 98, nut 100 and washers 102, 104 (or otherwise connected, as desired). During assembly of the connection, the unit 50 is left around the cable 88 but need not be connected; instead, a collar 106 is included in the connection. This has a flange section 108 which is flat and drilled so that it can be included in the bolted connection, and which extends away from the connection alongside the cable 88 to an internally-threaded ring section 110 which extends around the cable 88. Thus, once the connection is complete, there will be a threaded ring 110 around the cable 88 and the unit 50 can be slid along the cable 88 so that the collar 62 can be screwed into the threaded ring 110 in order to connect it to the live conductor 90.

Thus, the present invention provides a monitoring device for electrical distribution cables that can be fitted at minimal initial cost, but with the ability to be upgraded at a later date to provide more comprehensive monitoring if that was later desired.

It will of course be understood that many variations may be made to the above-described embodiment without departing from the scope of the present invention.

The invention claimed is:
1. An electrical sensor unit, attachable to an electrical distribution cable and comprising:
an elongate annular body formed of an electrically insulating material and defining an axial passage through which an electrical conductor can pass, the annular body housing at least one electrical sensor in the form of a current sensor, the unit including a coil comprising multiple loops, the loops extending circumferentially around the axial passage so that the axial passage is perpendicular to the plane of the loops, the coil being configured to experience an induced current due to the current being transmitted in the cable, the annular body further housing a voltage sensor for sensing the cable voltage, a control unit being provided to determine cable current and voltage levels from signals from the current and voltage sensors, and to calculate phase angle from the current and voltage data,
a source of electrical power for driving the electrical sensors, and
a socket in the form of an elongate recess aligned with the axis for releasably receiving a plug-in environmental sensor and comprising connections for the source of electrical power.

2. The electrical sensor unit according to claim 1, further comprising a contact for making electrical contact with the cable and in electrical contact with the voltage sensor.

3. The electrical sensor unit according to claim 2, in which the contact comprises a screw threaded collar for fitting over the end of and sliding along the electrical distribution cable.

4. The electrical sensor unit according to claim 1, in which the source of electrical power is a battery.

5. The electrical sensor unit according to claim 4, in which the battery is located in the socket and the connections receive power from the battery and supply it to the electrical sensors, the battery being removable and replaceable with the environmental sensor.

6. The electrical sensor unit according to claim 5, in which the environmental sensor comprises a battery.

7. The electrical sensor unit according to claim 1, in which the source of power is an inductive coil arrangeable around the electrical distribution cable.

8. The electrical sensor unit according to claim 1, in combination with an environmental sensor.

9. The electrical sensor unit according to claim 8, in which the environmental sensor senses at least one of temperature, partial discharge, humidity, atmospheric pressure.

10. The electrical sensor unit according to claim 1, wherein the socket is fitted with one of the group consisting of:
a blanking plug,
a battery,
a temperature sensor,
a partial discharge sensor,
a humidity sensor,
an atmospheric pressure sensor,
a sensor for detecting a two or more of:
temperature,
partial discharge,
humidity,
atmospheric pressure.

11. The electrical sensor unit according to claim 1, in which the socket is a recess within the unit, and the connections are located at a base of the recess.

12. The electrical sensor unit according to claim 1, adapted for attachment to a cable other than a suspended cable.

13. The electrical sensor unit according to claim 12, in which the cable is an underground cable.

14. The electrical sensor unit according to claim 1, adapted for attachment to a cable which comprises at least one electrical conductor surrounded by one or more layers of electrically insulative material.

15. The electrical sensor unit according to claim 1, in which the control unit is enclosed within the electrically insulating material of the annular body.

* * * * *